(12) United States Patent
Kim

(10) Patent No.: US 8,575,600 B2
(45) Date of Patent: Nov. 5, 2013

(54) ORGANIC LIGHT EMITTING DIODE DISPLAY

(75) Inventor: Do-Ik Kim, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 89 days.

(21) Appl. No.: 13/181,465

(22) Filed: Jul. 12, 2011

(65) Prior Publication Data
US 2012/0168778 A1  Jul. 5, 2012

(30) Foreign Application Priority Data
Dec. 29, 2010 (KR) .................... 10-2010-0138193

(51) Int. Cl.
*H01L 29/08* (2006.01)

(52) U.S. Cl.
USPC .. 257/40; 257/88; 257/E27.119; 257/E25.008

(58) Field of Classification Search
USPC .................. 257/40, 88, E27.119, E25.008
See application file for complete search history.

(56) References Cited

U.S. PATENT DOCUMENTS

| 6,898,340 | B2* | 5/2005 | Tanaka .......................... 385/14 |
| 7,087,985 | B2* | 8/2006 | Park et al. ..................... 257/676 |
| 2008/0299861 | A1* | 12/2008 | Ishihara et al. ................. 445/24 |
| 2009/0200936 | A1* | 8/2009 | Kang et al. ..................... 313/505 |
| 2009/0251050 | A1* | 10/2009 | Seo ............................... 313/504 |
| 2010/0148204 | A1* | 6/2010 | Ikeda et al. ..................... 257/98 |
| 2010/0237373 | A1* | 9/2010 | Yamazaki et al. ............... 257/98 |

FOREIGN PATENT DOCUMENTS

| KR | 10-1999-0046876 | 7/1999 |
| KR | 10-2010-0042799 A | 4/2010 |

* cited by examiner

*Primary Examiner* — A. Sefer
*Assistant Examiner* — Farid Khan
(74) *Attorney, Agent, or Firm* — Christie, Parker & Hale, LLP

(57) ABSTRACT

An OLED display includes a substrate, a first electrode on the substrate, an organic emission layer on the first electrode, a second electrode on the organic emission layer, an insulating layer substantially covering the second electrode and having an opening that exposes a center portion of the second electrode, and a power supply electrically coupled with the second electrode through the opening of the insulating layer and configured to supply power to the second electrode.

12 Claims, 5 Drawing Sheets

ORGANIC LIGHT EMITTING DIODE DISPLAY

CROSS-REFERENCE TO RELATED APPLICATION

This application claims priority to and the benefit of Korean Patent Application No. 10-2010-0138193 filed in the Korean Intellectual Property Office on Dec. 29, 2010, the entire contents of which are incorporated herein by reference.

BACKGROUND

1. Field

An exemplary embodiment of the present invention relates to an organic light emitting diode (OLED) display.

2. Description of Related Art

An organic light emitting diode (OLED) display is a self emissive display device that displays images with organic light emitting diodes. The organic light emitting diode emits light with current received through a power wire. In general, the power wire is coupled to an edge of a substrate of the OLED display and transmits a current to the organic light emitting diode.

However, the power wire has resistance, and a voltage drop (IR-drop) occurs due to the resistance. Thus, luminance of light emitted from the OLED display may be non-uniform at an edge and a center of the substrate.

The above information disclosed in this Background section is only for enhancement of understanding of the background of the described technology, and therefore it may contain information that does not form the prior art that is already known in this country to a person of ordinary skill in the art.

SUMMARY

The described technology has been made in an effort to provide an organic light emitting diode (OLED) display of which uniformity of luminance is improved and having a simple structure.

An OLED display according to an exemplary embodiment includes a substrate, a first electrode on the substrate, an organic emission layer on the first electrode, a second electrode on the organic emission layer, an insulating layer substantially covering the second electrode and having an opening that exposes a center portion of the second electrode, and a power supply electrically coupled with the second electrode through the opening of the insulating layer and configured to supply power to the second electrode.

The power supply may include a flexible printed circuit contacting the center portion of the second electrode through the opening of the insulating layer.

The power supply may include a connection metal layer on the insulating layer and contacting the center portion of the second electrode through the opening of the insulating layer, and a flexible printed circuit contacting the connection metal layer at an edge of the substrate.

The first electrode may include a transparent or transflective material, and the second electrode may include a reflective material.

Thicknesses of areas of the second electrode at a center of the substrate and at an edge of the substrate may be larger than a thickness of remaining areas of the second electrode.

Further, an OLED display according to another exemplary embodiment includes a substrate, a first electrode on the substrate, an organic emission layer on the first electrode, and a second electrode on the organic emission layer, wherein a thickness of an area of the second electrode at a center of the substrate is larger than a thickness of an area of the second electrode at an edge of the substrate.

The OLED display may further include a power supply electrically coupled with the second electrode at the edge of the substrate and configured to supply power to the second electrode.

The power supply may include a flexible printed circuit.

The OLED display may further include an insulating layer substantially covering the second electrode and having an opening exposing a center portion of the second electrode, and a power supply electrically coupled with the second electrode through the opening of the insulating layer and configured to supply power to the second electrode.

The power supply may include a flexible printed circuit contacting the center portion of the second electrode through the opening of the insulating layer.

The power supply may include a connection metal layer on the insulating layer and contacting the center portion of the second electrode through the opening of the insulating layer and a flexible printed circuit contacting the connection metal layer at the edge of the substrate.

The first electrode may include a transparent or transflective material, and the second electrode may include a reflective material.

According to the exemplary embodiments, luminance of the OLED display can be improved in uniformity while having a simple structure.

DETAILED DESCRIPTION

Figure 1:
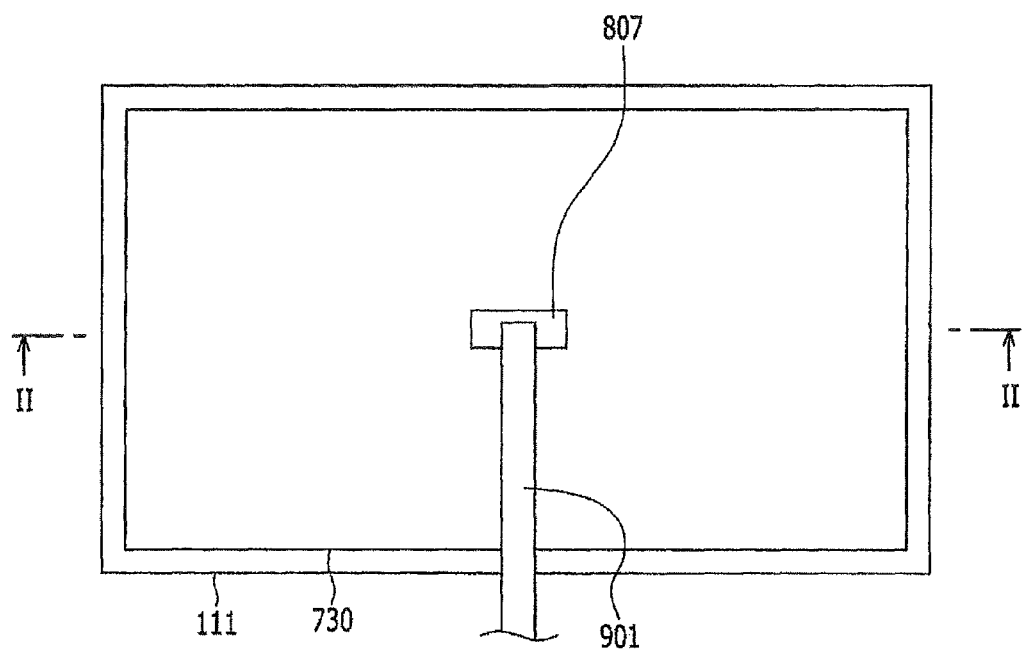
FIG. 1 is a schematic top plan view of an OLED display according to a first exemplary embodiment.

The present invention will be described more fully hereinafter with reference to the accompanying drawings, in which exemplary embodiments of the invention are shown. As those skilled in the art will realize, the described embodiments may be modified in various different ways, all without departing from the spirit or scope of the present invention.

Like reference numerals designate like elements throughout the specification. In exemplary embodiments other than the first exemplary embodiment among several exemplary embodiments, elements different from those of the first exemplary embodiment will be described.

Further, a size and thickness of each of the elements that are displayed in the drawings are described for better understanding and ease of description, and the present invention is not limited by the described size and thickness.

In the drawings, the thickness of layers, films, panels, regions, etc., are exaggerated for clarity. In the drawings, for better understanding and ease of description, thicknesses of some layers and areas are excessively displayed, or exaggerated. It will be understood that when an element such as a layer, film, region, or substrate is referred to as being "on" another element, it can be directly on the other element or intervening elements may also be present.

Hereinafter, an organic light emitting diode (OLED) display according to a first exemplary embodiment will be described with reference to FIG. 1 and FIG. 2.

Figure 2:
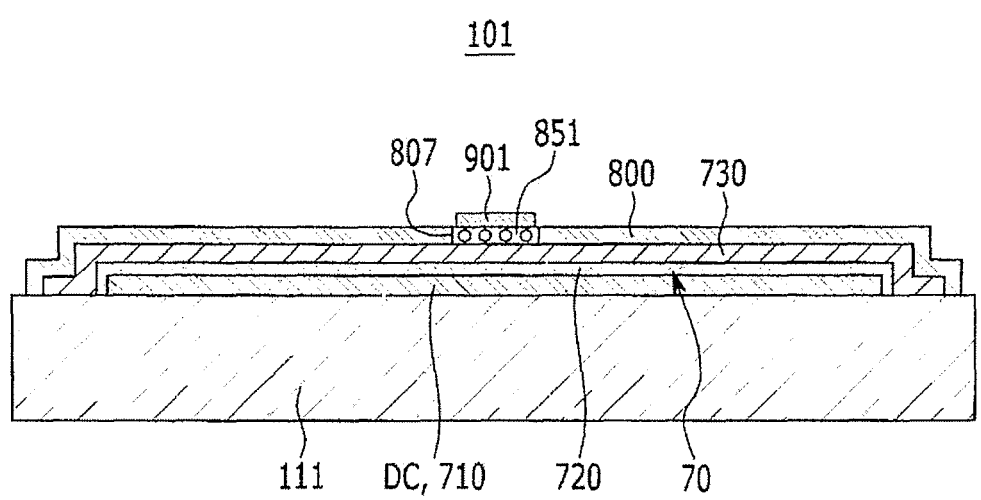
FIG. 2 is a schematic cross-sectional view of the OLED display of FIG. 1 taken along the line II-II.

As shown in FIG. 1 and FIG. 2, an OLED display 101 according to the first exemplary embodiment includes a substrate 111, a driving circuit DC, an organic light emitting element 70, and a power supply 901.

The substrate 111 may be formed with a transparent insulating substrate made of glass, quartz, ceramic, and the like, or may be formed with a transparent flexible substrate made of plastic.

Figure 3:
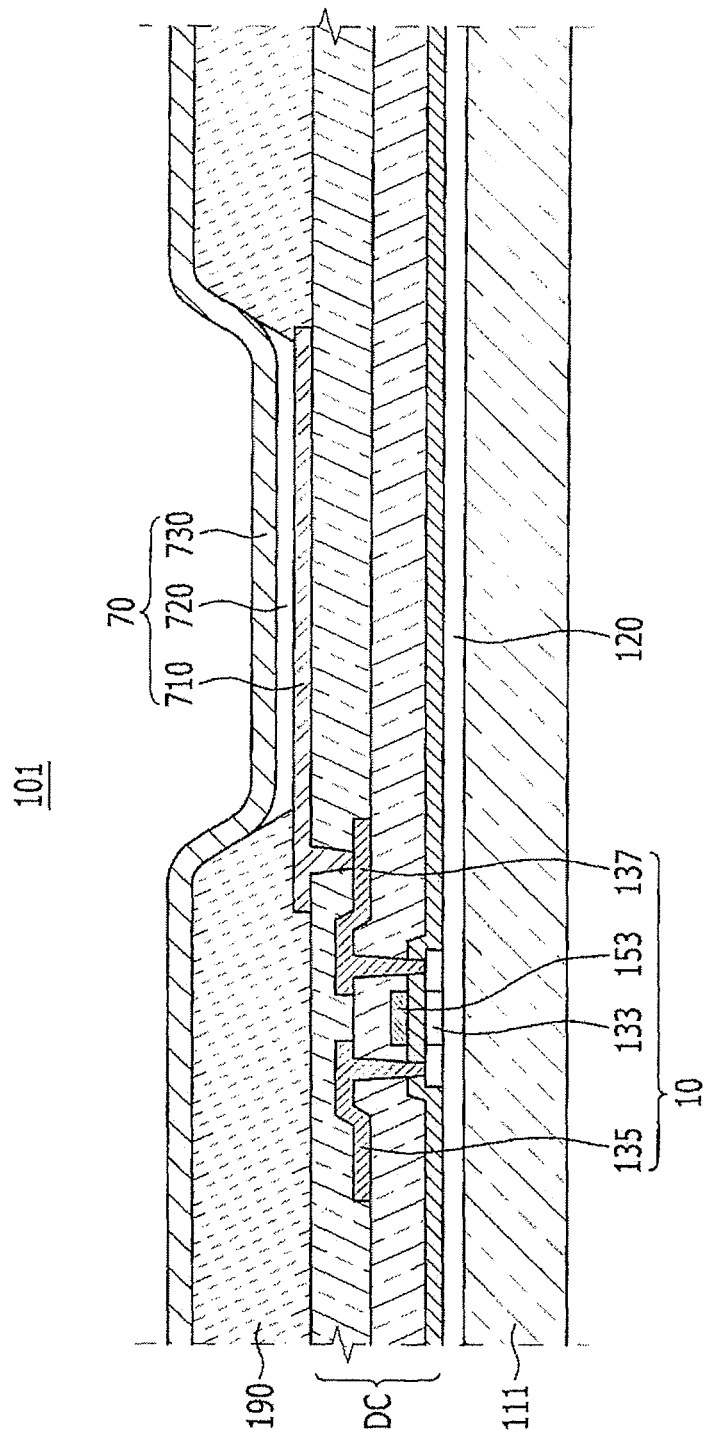
FIG. 3 is an enlarged cross-sectional view of the OLED display of FIG. 1.

As shown in FIG. 3, the driving circuit DC includes a thin film transistor 10, and the thin film transistor 10 is coupled with the organic light emitting element 70. That is, the organic light emitting element 70 emits light according to a driving signal transmitted from the driving circuit DC to display an image. In further detail, the thin film transistor 10 includes a semiconductor layer 133, a gate electrode 153, a source electrode 135, and a drain electrode 137. The drain electrode 137 is coupled with a first electrode 710 of the organic light emitting element 70.

In FIG. 3, a semiconductor layer 133 of the thin film transistor 10 may be a polycrystalline semiconductor layer 133, and has a top gate structure in which a gate electrode 153 is formed on the semiconductor layer 133. However, the first exemplary embodiment is not limited thereto. Thus, the structure of the thin film transistor 10 may be variously modified within a range known to a person skilled in the art.

The OLED display 101 further includes a buffer layer 120. The buffer layer 120 may be formed through chemical vapor deposition or physical vapor deposition, and may have a single-layered structure or a multi-layered structure including various insulating layers, such as a silicon oxide film, silicon nitride film, and the like, known to the skilled person in the art.

The buffer layer 120 serves to prevent moisture or impurities generated from the substrate 111 from spreading or from infiltrating, to smooth the surface, and to regulate a heat transfer speed during a crystallization process performed for forming the semiconductor layer 133 to thus accomplish desirable crystallization.

According to other embodiments of the present invention, the buffer layer 120 may be omitted depending on the type and process conditions of the substrate 111.

The organic light emitting element 70 includes the first electrode 710, an organic emission layer 720, and a second electrode 730. The first electrode 710 is an anode that is a hole injection electrode, and the second electrode 730 is a cathode that is an electron injection electrode. However, the first exemplary embodiment is not limited thereto. That is, the first electrode 710 may be a cathode and the second electrode 730 may be an anode.

The organic emission layer 720 has a multi-layered structure including an emission layer and at least one of a hole injection layer (HIL), a hole transport layer (HTL), an electron transport layer (ETL), and an electron injection layer (EIL). Excluding the emission layer 720, other layers may be omitted as necessary. If the organic emission layer 720 includes all the layers, the hole injection layer (HIL) is disposed on the transparent layer, which is the hole injection electrode, and the hole transport layer (HTL), the emission layer, the electron transport layer (ETL), and the electron injection layer (EIL) are sequentially stacked thereon. Alternatively, the organic emission layer 720 may include other layers as necessary.

The first electrode 710 is formed for each pixel or pixel unit. Here, the pixel is the minimum unit for the OLED display 101 to display an image. Meanwhile, the second electrode 730 is formed throughout several pixels, or formed throughout the front surface of the substrate 111.

In addition, the first electrode 710 is formed with a transparent material or a transflective material, and the second electrode 730 is formed with a reflective material. The transparent material includes at least one of indium tin oxide (ITO), indium zinc oxide (IZO), zinc indium tin oxide (ZITO), gallium indium tin oxide (GITO), indium oxide ($In_2O_3$), zinc oxide (ZnO), gallium indium zinc oxide (GIZO), gallium zinc oxide (GZO), fluorine tin oxide (FTO), and aluminum-doped zinc oxide (AZO).

The reflective material and the transflective material may be formed with a metal. In this case, the reflective material and the transflective material are determined by thickness. In general, the transflective material may have a thickness of a range between 5 nm to 100 nm, and the thickness of the reflective material may be relatively larger than that of the transflective material. Depending on the thickness of the transflective material, transmittance and reflectivity of light are changed. In further detail, transmittance of the light is increased as the thickness of the transflective material is decreased, and reflectivity of the light is decreased as the thickness of the transflective material is increased. Further, transmittance of light varies according to thickness. When the thickness of the transflective material is larger than 100 nm, transmittance of light is significantly decreased. When the thickness of the transflective material is less than 5 nm, an electric characteristic is deteriorated.

Further, when the first electrode 710 is formed with a transflective material and the second electrode 730 is formed with a reflective material, light use efficiency of the OLED display 101, that is, luminance of the OLED display 101, can be improved using a microcavity effect. The microcavity effect can be maximized by controlling a distance between the first electrode 710 and the second electrode 730 of the organic light emitting element 70.

The OLED display 101 may further include a pixel defining layer 190. The pixel defining layer 190 has an opening portion that at least partially exposes the first electrode 710. The organic emission layer 720 emits light in the opening portion of the pixel defining layer 190. That is, the opening portion of the pixel defining layer 190 defines an area where light is substantially emitted.

Referring to FIG. 1 and FIG. 2, the OLED display 101 further includes an insulating layer 800 covering the second electrode 730. The insulating layer 800 has an opening that partially exposes a center portion of the second electrode 730.

The power supply 901 is electrically coupled with the second electrode 730 and supplies power thereto. The power supply 901 includes a flexible printed circuit (FPC) contacting the center portion of the second electrode 730 through the opening 807 of the insulating layer 800. The flexible printed circuit (FPC) contacts the second electrode 730 through an anisotropic conductive film (ACF) 851. The anisotropic conductive film 851 includes an adhesive layer and conductive balls included in the adhesive layer, and may further include various configurations known to a person skilled in the art.

With such a configuration, the OLED display 101 according to the first exemplary embodiment can have improved uniformity while having a simplified structure. That is, the luminance in the center portion of the OLED display 101 can be prevented from being further deteriorated compared to a peripheral area thereof.

Hereinafter, an OLED display 102 according to a second exemplary embodiment will be described with reference to FIG. 4 and FIG. 5.

Figure 4:
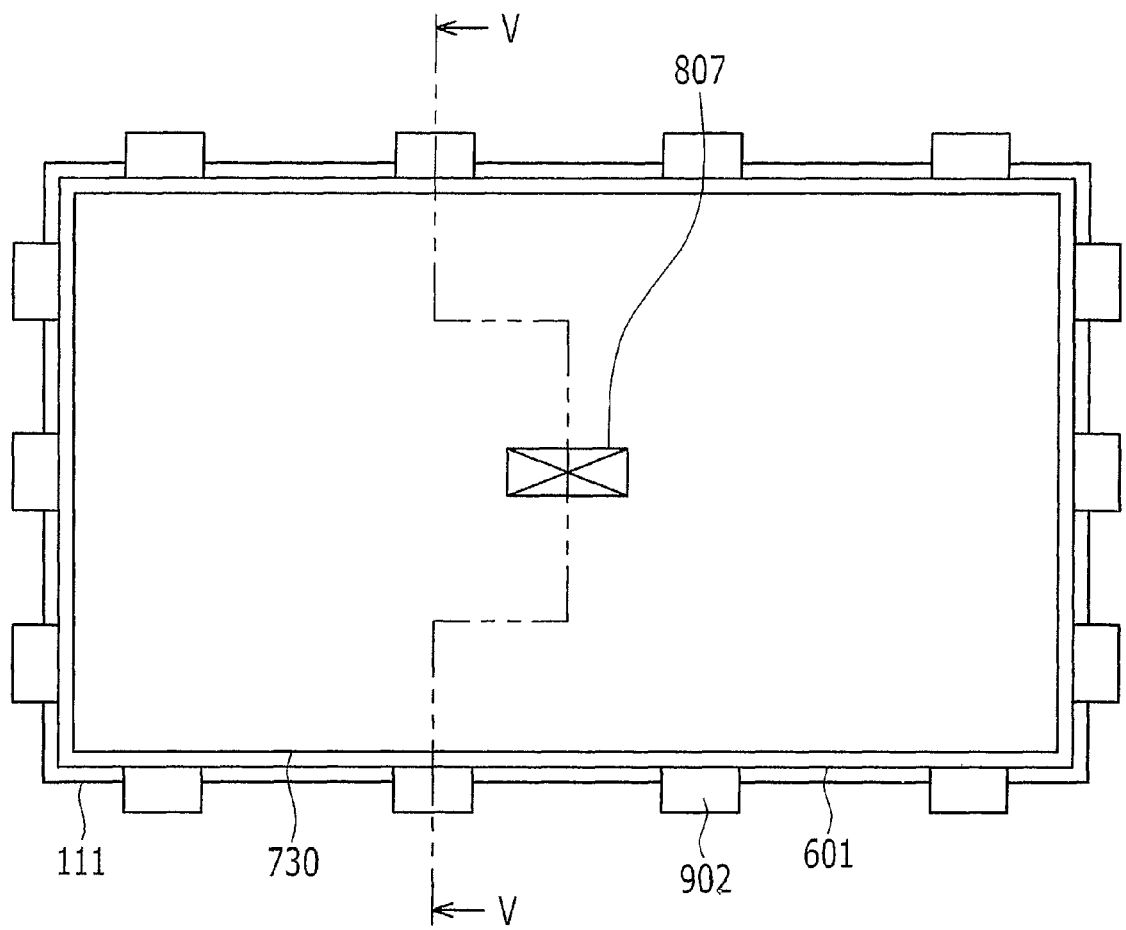
FIG. 4 is a schematic top plan view of an OLED display according to a second exemplary embodiment.
Figure 5:
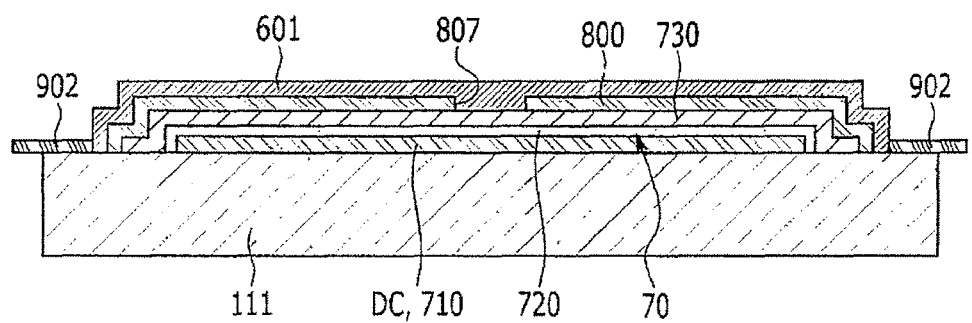
FIG. 5 is a cross-sectional view of the OLED display of FIG. 4 taken along the line V-V.

As shown in FIG. 4 and FIG. 5, the OLED display 102 according to the second exemplary embodiment includes a connection metal layer 601 formed on an insulating layer 800, and partially contacting a center portion of a second electrode 730 through an opening 807 of the insulating layer 800, and a power supply having a flexible printed circuit (FPC) 902 contacting the connection metal layer 601 at an edge of a substrate 111. That is, the flexible printed circuit (FPC) 902 is attached to the edge of the substrate 111, but supplies power through the center portion of the second electrode 730 through the connection metal layer 601.

With such a configuration, the OLED display 102 according to the second exemplary embodiment can have improved uniformity while having a simplified structure.

Hereinafter, a third exemplary embodiment will be described with reference to FIG. 6.

Figure 6:
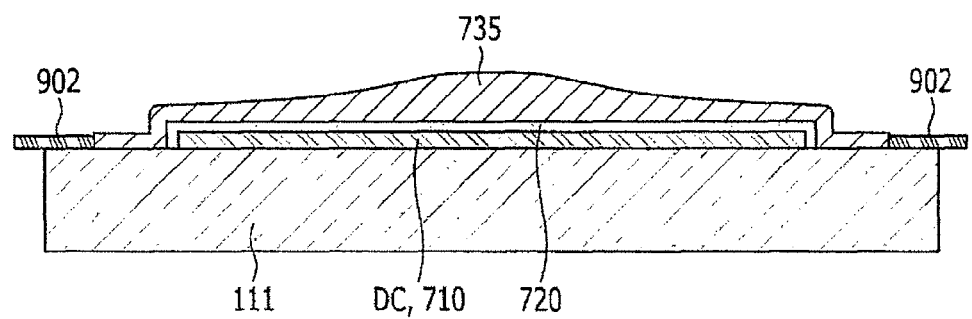
FIG. 6 is a cross-sectional view of an OLED display according to a third exemplary embodiment.

As shown in FIG. 6, in an OLED display 103 according to the third exemplary embodiment, the thickness of a second electrode 735 of an organic light emitting element 70 at an edge of a substrate 111 is relatively smaller than the thickness at a center of the substrate 111. That is, resistance of the center portion of the second electrode 735 is reduced by increasing the thickness at the center portion thereof. Thus, a voltage drop (IR-drop) occurs due to the resistance of the second electrode 735 so that deterioration of luminance at the center portion of the OLED display 103 can be suppressed.

In FIG. 6, the flexible printed circuit (FPC) 902, that is, a power supply, is coupled with the second electrode 735 at the edge of the substrate 111, but the third exemplary embodiment is not limited thereto. Thus, as in the first and second exemplary embodiments, the flexible printed circuit (FPC) 902 partially electrically couples the center portion of the second electrode 735, and the thickness of the center portion of the second electrode 735 can be increased.

With such a configuration, the OLED display 103 according to the third exemplary embodiment can have improved uniformity while having a simplified structure.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and their equivalents.

Description of Some of the Reference Characters

| | |
|---|---|
| 10 | thin film transistor |
| 70 | organic light emitting element |
| 101, 102, 103 | organic light emitting diode (OLED) display |
| 111 | substrate main body |
| 120 | buffer layer |
| 190 | pixel defining layer |
| 601 | connection metal layer |
| 710 | first electrode |
| 720 | organic emission layer |
| 730, 735 | second electrode |
| 800 | insulating layer |
| 807 | opening |
| 901 | power supply |
| DC: | driving circuit |

What is claimed is:

1. An organic light emitting diode (OLED) display device comprising:
    a substrate;
    a plurality of first electrodes on the substrate;
    a plurality of organic emission layers on respective ones of the first electrodes;
    a second electrode as a common electrode commonly on the plurality of organic emission layers for supplying power to all of the organic emission layers;
    an insulating layer substantially covering the second electrode and having a single opening for exposing a center portion of the second electrode; and
    a power supply electrically coupled with the second electrode through the opening of the insulating layer and configured to supply the power to all of the organic emission layers via the second electrode.

2. The OLED display device of claim 1, wherein the second electrode is thicker at a center of the substrate than at an edge of the substrate.

3. The OLED display device of claim 1, wherein the power supply comprises a flexible printed circuit contacting the center portion of the second electrode through the opening of the insulating layer.

4. The OLED display device of claim 1, wherein the power supply comprises:
    a connection metal layer on the insulating layer and contacting the center portion of the second electrode through the opening of the insulating layer; and
    a flexible printed circuit contacting the connection metal layer at an edge of the substrate.

5. The OLED display device of claim 1, wherein the first electrode comprises a transparent or transflective material, and the second electrode comprises a reflective material.

6. An organic light emitting diode (OLED) display device comprising:
    a substrate;
    a first electrode on the substrate;
    an organic emission layer on the first electrode; and
    a second electrode on the organic emission layer,
    wherein a thickness of an area of the second electrode at a center of the substrate is larger than a thickness of an area of the second electrode at an edge of the substrate.

7. The OLED display device of claim 6, wherein the first electrode comprises a transparent or transflective material, and the second electrode comprises a reflective material.

8. The OLED display device of claim 6, further comprising a power supply electrically coupled with the second electrode at the edge of the substrate and configured to supply power to the second electrode.

9. The OLED display device of claim 8, wherein the power supply comprises a flexible printed circuit.

10. The OLED display device of claim 6, further comprising an insulating layer substantially covering the second electrode and having an opening exposing a center portion of the second electrode, and a power supply electrically coupled with the second electrode through the opening of the insulating layer and configured to supply power to the second electrode.

11. The OLED display device of claim 10, wherein the power supply comprises a flexible printed circuit contacting the center portion of the second electrode through the opening of the insulating layer.

12. The OLED display device of claim 10, wherein the power supply comprises:
- a connection metal layer on the insulating layer and contacting the center portion of the second electrode through the opening of the insulating layer; and
- a flexible printed circuit contacting the connection metal layer at the edge of the substrate.

* * * * *